United States Patent [19]

Ishikawa et al.

[11] Patent Number: 5,524,401
[45] Date of Patent: Jun. 11, 1996

[54] ROOF WITH SOLAR BATTERY

[75] Inventors: Osamu Ishikawa; Naoko Oya, both of Tokyo, Japan

[73] Assignee: Misawa Homes Co., Ltd., Tokyo, Japan

[21] Appl. No.: 295,909

[22] PCT Filed: Jan. 11, 1994

[86] PCT No.: PCT/JP94/00025

§ 371 Date: Oct. 25, 1994

§ 102(e) Date: Oct. 25, 1994

[87] PCT Pub. No.: WO94/16170

PCT Pub. Date: Jul. 21, 1994

[30] Foreign Application Priority Data

Jan. 12, 1993 [JP] Japan .................................. 5-003617
Jan. 12, 1993 [JP] Japan .................................. 5-003618
Jan. 12, 1993 [JP] Japan .................................. 5-003619

[51] Int. Cl.⁶ .................................................. E04D 13/18
[52] U.S. Cl. ...................... 52/173.3; 136/246; 136/251; 136/291
[58] Field of Search .................................. 136/246, 251, 136/291; 52/173.3

[56] References Cited

U.S. PATENT DOCUMENTS 4,336,413  6/1982  Tourneux .................................. 136/251
4,936,063  6/1990  Humphrey .................................. 52/200

FOREIGN PATENT DOCUMENTS

| 59-152670 | 8/1984 | Japan | 136/291 |
| 59-175168 | 10/1984 | Japan | 136/251 |
| 64-33840 | 3/1989 | Japan | 52/173.3 |
| 3-905 | 1/1991 | Japan | 52/173.3 |
| 4-23701 | 4/1992 | Japan | 52/173.3 |

*Primary Examiner*—Aaron Weisstuch
*Attorney, Agent, or Firm*—Lowe, Price, LeBlanc & Becker

[57] ABSTRACT

A roof with solar battery Y is structured to support the solar battery module 3 on the base panel 2 by means of cores 6 and frame 11. The solar battery can be ventilated by air flow through ventilation layer 1A between the solar battery module 3 and the base panel 2. The frame 11 is designed to provide waterproofing by the seal members 12 and 14 inserted into the large C portions 13 and 15. The respective solar battery module 3 is surrounded by the square shaped frame 32 to prevent water seepage by means of extending frame member 39. The single roof panel 1 has a predetermined number of solar battery cells 10 to obtain the necessary voltage.

17 Claims, 8 Drawing Sheets

ROOF WITH SOLAR BATTERY

BACKGROUND OF THE INVENTION

1. Field of the Invention

This invention relates to a roof with a solar battery and is expected to be used as a roof of house. There are provided solar batteries in the roof to generate electric energy.

2. Description of the Related Art

Solar batteries have been used to supply electric power to a house as a part of a roof structure having the solar batteries thereon in order to reduce consumption of energy from conventional sources.

The frame fixing method in which the panel type solar battery unit is secured on an established roof with a dedicated frame, is generally known. It has also been known in the art to arrange so-called solar battery roofing tiles with built-in solar batteries on the roof panel.

There are, however, the following defects associated with the frame fixing method.

First of all, a separate process is required for frame anchoring, and the roofing materials made of roofing tile, roofing board, and rafters are damaged, and it is difficult to obtain a durable watertight structure.

In addition, electrical wires of the solar battery are apt to be influenced by wind, rain, and sun light.

On the other hand, there are the following defects associated with the solar battery roofing tiles.

The electric connections prepared at the joints of the roofing tiles may be damaged by rain-water.

As one modern method of installing the solar batteries on the roof, a roofing technique, in which plural roof panels defining a roof and plural solar battery modules in an associated state, has been developed.

The roof with solar battery provided as a solar battery module allows installation of the solar battery at the same time of installing the roof and provides avoidance of the exposure of the electric wiring and the leakage of rain-water. Thus it avoids the defects in the above-mentioned conventional solar battery installation.

The solar battery module attached to each roof panel is formed with many solar battery cells (solar battery elements) on the surface in a general rectangular thin panel state. Its dimensions are established for fitting the external dimensions of the roof panel on which the solar battery modules are arranged along its length and width.

The required output voltage can be obtained from the roof panel equipped with the appropriate number of solar battery modules.

Namely, the solar battery module provides the designated output voltage according to the solar battery cells formed on the surface of the solar battery module and the solar battery modules on the roof panel are connected in series.

The above roof with solar batteries has the following known disadvantages.

First, when the solar battery itself is excessively heated, energy conversion efficiency tends to drop.

Since the roof easily heats up under illumination by sun light, the solar battery in the roof also cannot avoid being in a high temperature condition.

Consequently, it is difficult to improve the energy conversion efficiency in use.

3. Objects of the Invention

The first object of this invention is to provide the roof with solar battery a way to radiate heat therefrom and to improve energy conversion efficiency.

Second, the joints naturally made between the plural solar battery modules are made watertight.

Thus, the second object of this invention is to provide a roof with solar battery which can be improved in watertightness between each solar battery module.

Third, in using the roof paneled solar battery, the number of the solar batteries on the roof panel is determined by the dimensions of the roof panel, that is, the output voltage of the roof panel is limited, whereby there is a problem of inadequate electrical power supply.

Namely, the electrical power generation by the roof with solar battery is determined by the voltage provided by the dimensions of the roof panel and the number of roof panels connected in parallel. The necessary electrical power is not necessarily always supplied, and the possibility of insufficient electrical power supply cannot be avoided.

Thus, the third object of this invention is to provide a roof with a solar battery which can supply sufficient electrical power.

SUMMARY OF THE INVENTION

1. A roof with a solar battery, has:

a base panel extending from the ridge portion to the eaves portion of a sloped roof of a house;

a solar battery panel arranged along an upper surface of the base panel;

a frame receiving the solar battery panel;

a supporting member supporting the frame on the base panel; and a ventilation layer provided between the solar battery panel and the base panel to smoothly ventilate air.

The ventilation layer is opened at the eaves portion and the ridge portion.

The base panel has dimensions corresponding to the roof panel and is provided with sufficient solar battery panels to provide a necessary voltage, the respective solar battery panels on each base panel being electrically interconnected to one another.

The supporting member extends to the eaves portion and is provided thereon with flashing.

The flashing is formed thereunder with a heat insulation member. The eaves portion has flashing thereon and thereunder, the space between them being communicated with the ventilation layer and provided with a ventilation louver.

The supporting member extends to the eaves portion and has thereon and thereunder the eaves flashing, the space between them being related to the ventilation layer and provided with a ventilation louver and the upper eaves flashing being finished thereon with a white-colored coating.

The frame is structured into a lattice shape, the lattice shape having a C-shaped portion to engage with peripheral portions of the solar battery panel, wherein the solar battery panel is held at the C-shaped portion through a seal member.

The frame has a square shape to surround the respective solar battery panels.

Among the side-by-side arranged solar battery panels along the slope direction of the roof, the eaves portion of the frame of the solar battery panel near the ridge side is formed with an extending piece, the extending piece extending to the ridge portion of the frame of the solar battery panel at the eaves side.

The extending piece has a tapered portion extending from the upper surface of the frame of the solar battery panel at the ridge side and a flattened portion parallelly arranged along the upper surface of the frame of the solar battery panel at the eaves side.

Seal members are provided between the frame of the solar battery panel at the ridge side and the frame of the adjacent solar battery panels at the eaves side.

(2) A roof with a solar battery, has;

a base panel extending from the ridge portion to the eaves portion of a sloped roof of house;

a solar battery panel arranged along an upper surface of the base panel;

a frame receiving the solar battery panel;

a supporting member supporting the frame on the base panel; and a ventilation layer provided between the solar battery panel and the base panel to smoothly ventilate air, the supporting member extending to the eaves portion and having thereon and thereunder eaves flashing, a space between them being communicated with the ventilation layer and provided with a ventilation louver, and the upper eaves flashing being finished thereon with a white-colored coating, the frame having a square shape to surround respective solar battery panels, among side-by-side arranged solar battery panels along the slope direction of the roof, the eaves portion of the frame of the solar battery panel near the ridge portion being formed with an extending piece, the extending piece extending to the ridge portion of the frame of the solar battery panel at the eaves side.

The extending piece has a tapered portion extending from the upper surface of the frame of the solar battery panel at the ridge portion and a flattened portion parallelly arranged along the upper surface of the frame of the solar battery panel at the eaves side.

Seal members are provided between the frame of the solar battery panel at the ridge side and the frame of the adjacent solar battery panels at the eaves side.

(3) A roof with a solar battery, has:

a base panel extending from the ridge portion to the eaves portion of a sloped roof of a house;

a solar battery panel arranged along an upper surface of the base panel;

a frame receiving the solar battery panel;

a supporting member supporting the frame on the base panel; and a ventilation layer provided between the solar battery panel and the base panel to smoothly ventilate air, the ventilation layer being opened at the eaves portion and the ridge portion, the supporting member extending to the eaves portion and has thereon and thereunder the eaves portion, the space between them being communicated with the ventilation layer provided with a ventilation louver, and the upper eaves flashing being finished thereon with a white-colored coating, and the base panel having dimensions corresponding to a roof panel and provided with the necessary battery panels to provide a required voltage, the respective solar battery panels on each base panel being electrically connected to one another, the frame having a square shape to surround respective solar battery panels, among side-by-side arranged solar battery panels along the slope direction of the roof, the eaves portion of the frame of the solar battery panel near the ridge side being formed with an extending piece, the extending piece extending to the ridge portion of the frame of the solar battery panel at the eaves side, the extending piece having a tapered portion extending from the upper surface of the frame of the solar battery panel at the ridge portion and a flattened portion parallelly arranged along the upper surface of frame of the solar battery panel at the eaves side, and seal members being provided between the frame of the solar battery panel at the ridge side and the frame of the adjacent solar battery panels at the eaves side.

DETAILED DESCRIPTION OF THE PREFERRED EMBODIMENTS

The embodiments of the present invention will be described with reference to the drawings.

Figure 1:
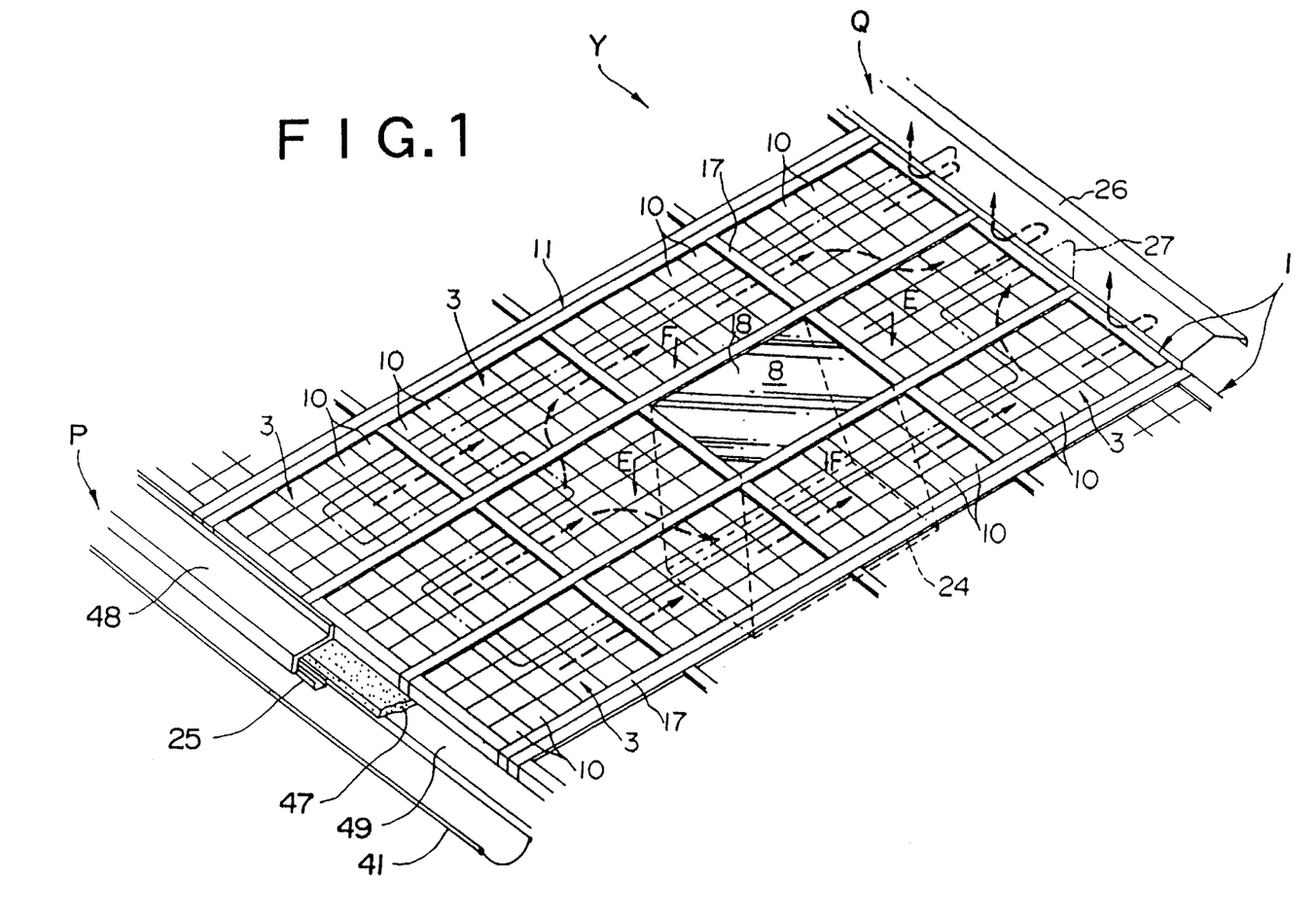
FIG. 1 is a schematically view of a first embodiment in accordance with the present invention.
Figure 5:
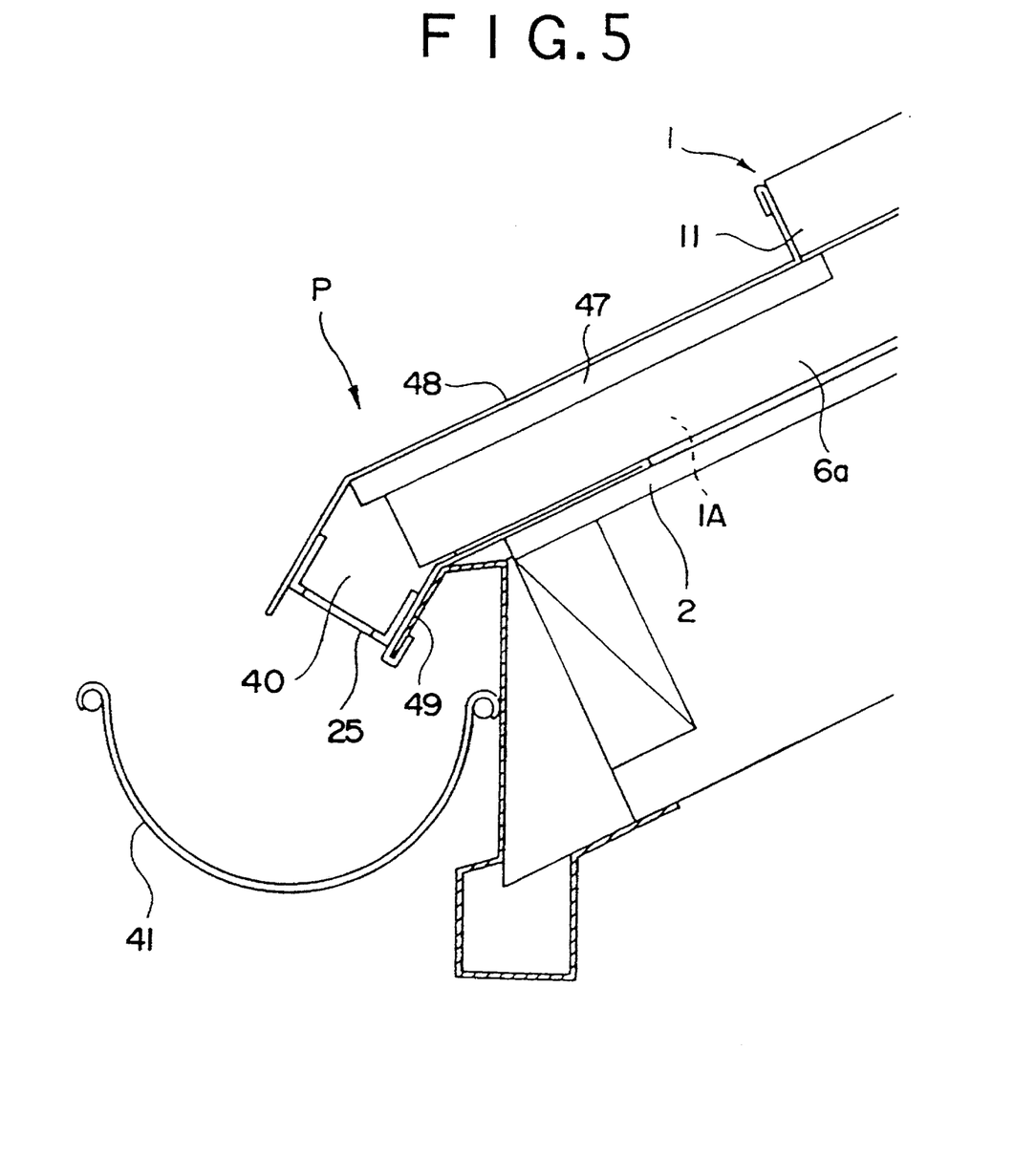
FIG. 5 is a sectional view of an eaves portion of the first embodiment.

FIGS. 1 and 5 depict examples of the first embodiment in accordance with the present invention.

FIG. 1 depicts a roof with a solar battery array Y of a house with a roof panel (1) with solar batteries. One or more roof panels (1) can be utilized as necessary, so that the entire surface of the roof is covered therewith.

The roof panel (1) comprises plural flat solar battery modules (hereinafter referred to as module) (3) attached to a rectangular base panel (2), as a base structure, along the roof sloped from eaves P to a corresponding ridge Q.

Figure 2:
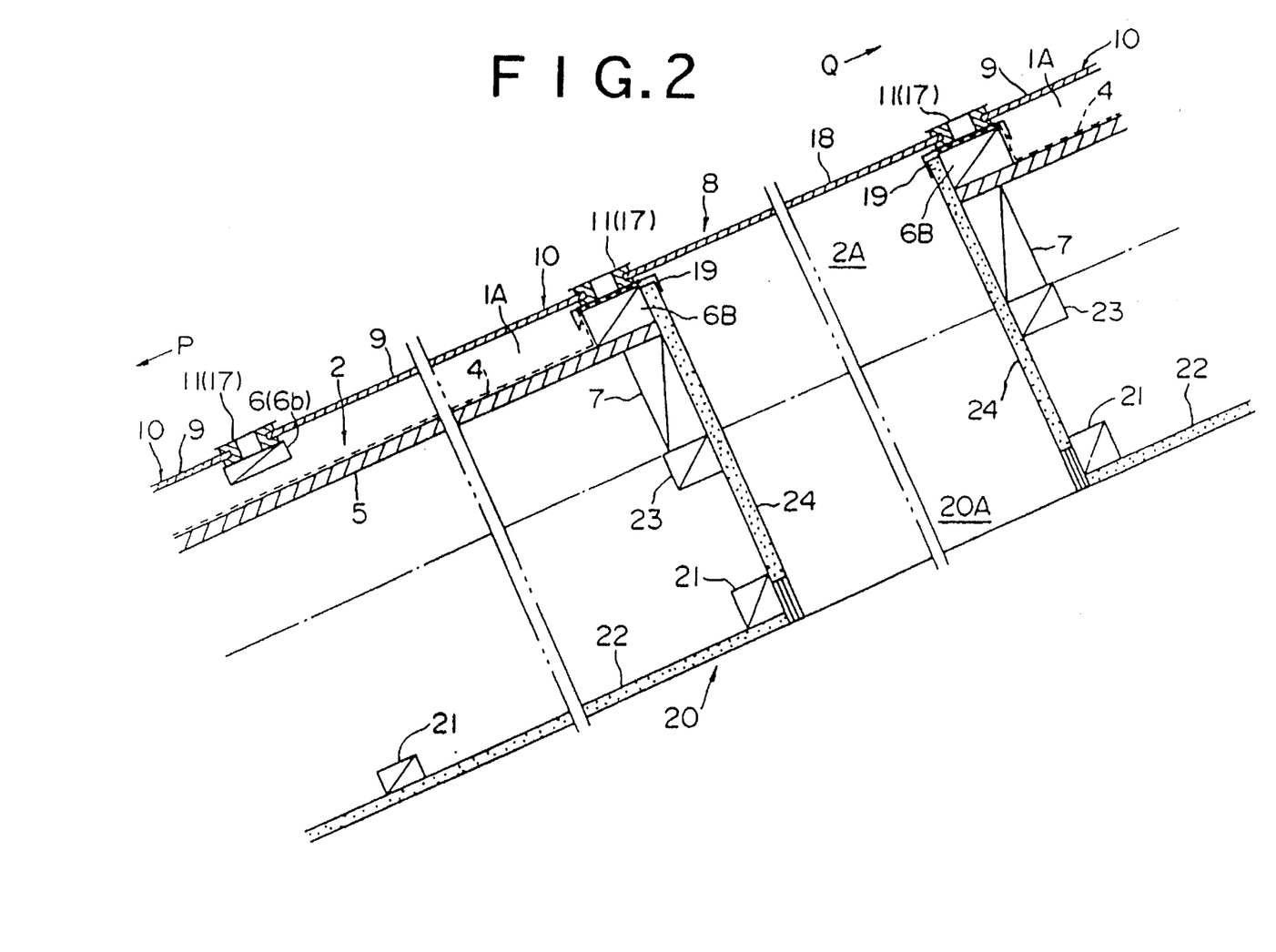
FIG. 2 is a sectional view taken along the E—E line of FIG. 1.
Figure 3:
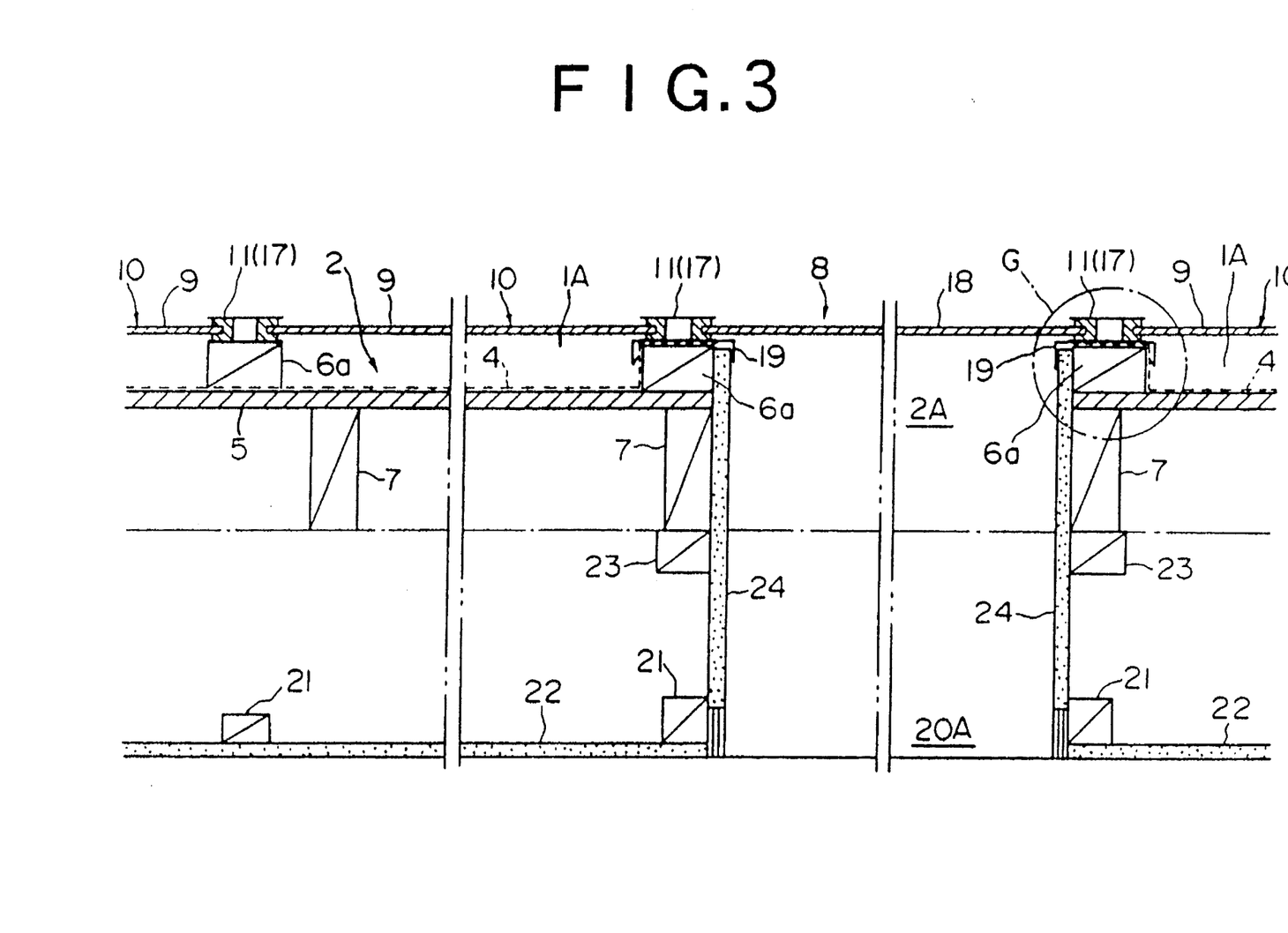
FIG. 3 is a sectional view taken along the F—F line of FIG. 1.

The base panel (2), as depicted in FIGS. 2 and 3, is defined by a rectangular plywood sheet (5) which has an asphalt roofing layer (4) spread thereon, plural cores (6) as supporting member at its upper side and common rafters (7) at its lower side. The cores (6) and common rafters (7) are secured on and under the plywood (5) by means of a bonding agent and nails in a lattice pattern.

A core (6) is structured with longitudinal cores (6a) extending in a longitudinal direction from one end to the other end of the base panel (2) and transverse cores (6b) provided between the longitudinal cores (6a) to perpendicularly intersect with the longitudinal cores (6a), the transverse cores (6b) being made to have thinner thickness than and secured to the longitudinal cores (6a) so that both upper surfaces form a flat plane thereby, but in practice, only the longitudinal cores (6a) are directly secured to plywood (5) from which the transverse core (6b) is spaced away a little.

A solar battery module (3) is formed in a panel combined with plural solar battery cells (1) (6 in length×4 in width= 24), in a rectangular state by means of not-shown connecting members, which are covered with square transparent plates (9).

The solar battery can be an energy converter using a P-N junction, that is, in which a 1–3μ thick P-type layer on an N-type Si wafer is provided, so that a so-called photoelectromotive force occurs when sunlight falls on the P-N junction from the surface thereof.

The modules (3) are arranged in a frame (11) of nearly the same dimensions as the base panel (2).

Figure 4:
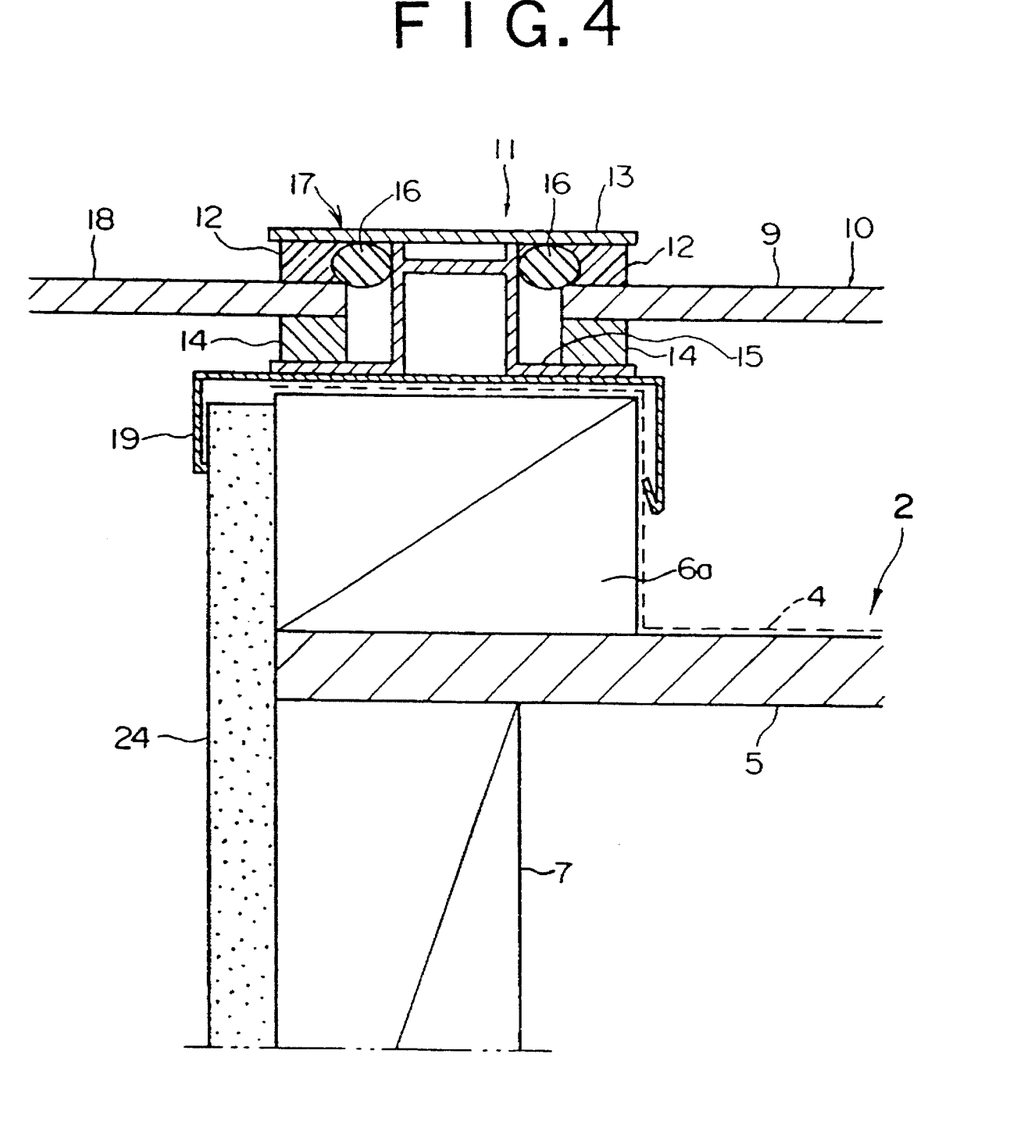
FIG. 4 is an enlarged sectional view at "G" in FIG. 3.

The frame (11) is as shown in FIG. 4. Frame members (17) are assembled in a lattice condition in accordance with the shape of the previous blocks, the frame member (17) consisting of flat upper plates (13), at both lower transverse end portions thereof, attached with sealing members (12), a lower plate (15) formed into a convex shape and attached with sealing members (14) at both upper transverse end portions, and packing (16) held between the underside of the upper plates (13) and the upper side of the lower plates (15).

After the lower plates (15) are secured on the longitudinal cores (6a) or transverse cores (6b) by nailing, etc., respective edges of the module (3) (transparent plate (9) of the module (3)) are held between the sealing members (12 and 14), and the upper plate (13) is connected with the lower plate (15) by screw fasteners, etc., whereat edges of each module (3) are set and fixed into C-shaped portions formed by the upper plate (13) and lower plate (15).

As described above, the respective modules (3) are attached at the frame (11) in which the frame member (17) is located on the longitudinal cores (6a) and transverse cores (6b) of the aforedescribed base panel (2) by a bonding agent whereat the roof panel (1) is composed by the plural modules (3).

The roof panel (1) includes therein an air ventilation layer (1A), between the plywood (5) and the modules (3), which extends from the eaves P to the ridge Q as the transverse cores (6b) are isolated away from the plywood (5) as described above. In addition, the longitudinal cores (6a) are provided with a cut-out portion (not-shown) passing through next air ventilation layer (1A) of a neighbor block.

At the eaves P, as shown in FIG. 5, the longitudinal core (6a) reaches the end of the eaves P and from one end of the modules (3) of the eaves P to the other end of the eaves P, there is provided a fixed space into which a heat insulating board (47) is fitted on the longitudinal core (6a) entirely at the eaves area.

An upper eaves flashing (48) is attached on a heat-insulating board (47). And a lower eaves flashing (49) is attached on the pointed end of a base panel (2). Gutter 41 is mounted below the air intake 25 of the air ventilation space.

The surface of the upper eaves flashing (48) is painted white so as to hardly absorb heat.

The skylight sash portion (8) is formed as a block whereat the skylight sash portion (8) of the base panel (2) is cut open, and the abovedescribed longitudinal core (6a) and the transverse core (6B) that is the same thickness with the longitudinal core (6a) are secured on the upper surface edge of the plywood (5) around the opening (2A) and the above-described common rafter (7) is secured under the lower surface of the plywood (5).

As shown, between the frame members (17) corresponding to the skylight sash portion (8) of the frame (11), a glass pane (18) is fitted. The glass pane (18) is rectangular, having the same dimensions as module (3) and as is the module (3), fitted between the frame members (17).

The asphalt roofing layer (4) covers over the longitudinal core (6a) and transverse core (6B) provided around the skylight sash portion (8), and on the asphalt roofing (4), a flashing (19) formed into C-shape is inlaid and fixed. The flashing (19) is secured on the longitudinal core (6a) and transverse core (6B) along with the lower plate (15) of the frame (11).

On the other hand, as depicted in FIGS. 2 and 3, an interior ceiling (20) below the roof is structured with the ceiling joists (21) and the ceiling boards (22) which are made of a plasterboard, etc., and is secured to the joists (21). A portion aligned with the skylight sash portion (8) is cut out by a cutting process, etc., so as to form an opening (20A). Incidentally, at an upper portion of a ceiling board (19), the beams (23) are provided.

The roof panel (1) is located such that the skylight sash portion (8) thereof meets with the openings (20A) of the ceiling (20) and is mounted on the ceiling (20) as the common rafters (7) contact with the upper beams (23) to be securely connected to each other by means of a bonding agent, nails, or the like.

Therefore, from within the house, such as from living rooms below the ceiling (20), the outside can be seen through the glass pane (18), and the sunbeams stream into the house.

Now referring to the roof panel (1) of the above explained embodiment, the number of modules (3) for the single roof panel (1) totals up to 11, but in a practical use, it can be determined based upon consideration of the voltage obtained by a single module (3), the voltage required in the house.

Therefore, the modules (3) are multiplied in number to obtain the required voltage to be provided by the roof panel (1). The modules (3) are electrically connected in series by electrical wires in the air ventilation layer (1A) as plotted by a dotted line (27) in FIG. 1, and are also electrically connected with charging means (not shown) in house J from the inside of ridge metal fittings (26), so that the electric power supply in the house can be supplied from the charging means.

In the above structured roof Y, air flows into ridge ventilation metal fittings (26) from the ventilation louver (25) at the eaves P by way of the air ventilation layer (1A) in the roof panel 1.

Hence, the flowing air effects heat radiation from the back of solar battery modules (3), and temperature rise of the solar battery modules (3) is effectively suppressed. Consequently, energy conversion efficiency of the solar battery is preserved.

Moreover, the air ventilation layer (1A) extends along the slope to the ridge Q from the eaves P so that in the air ventilation layer (1A) rising air flow from the eaves P to the ridge Q is produced, and therefore, suppression of temperature increase in the modules 3 is promoted.

As a result, the energy conversion efficiency of the solar battery module (3) is always maintained high to obtain a stable electrical power supply.

It should be understood that the ventilation louver (25) as an air intake to air ventilation layer (1A) regulates the inflow into the air ventilation layer (1A) of rain-water or dust, and also acts as a spacer to maintain regular intervals between the upper eaves flashing (48) and the lower flashing (49).

Incidentally, the surface of the eaves flashing (48) forming a surface of the eaves P is painted white to reduce heat absorption so as to prevent a temperature rise of the air flowing into the air ventilation layer (1A).

And because the heat insulating board (47) under the eaves flashing (48) has a heat insulating effect, the inlet air into the air ventilation layer (1A) is reduced in temperature.

Further, the number of modules (3) provided on the roof panel (1) is decided upon in relation to the required voltage, so that supply of unnecessary high voltage or insufficient voltage can be averted, to thereby supply only the necessary voltage.

Since the electrical wire (27) of each module (3) is positioned in the air ventilation layer (1A), it is not influenced by the wind, rain, and direct sun light.

Furthermore, as the air ventilation layer (1A) passes through from the eaves p to the ridge Q, if the electrical wire (27) is wired so as to exit from the end of the ridge Q while the roof panel (1) is formed, effort for the electric wiring of the solar battery on the roof will not required at all and the time for the installation can be reduced.

Figure 6:
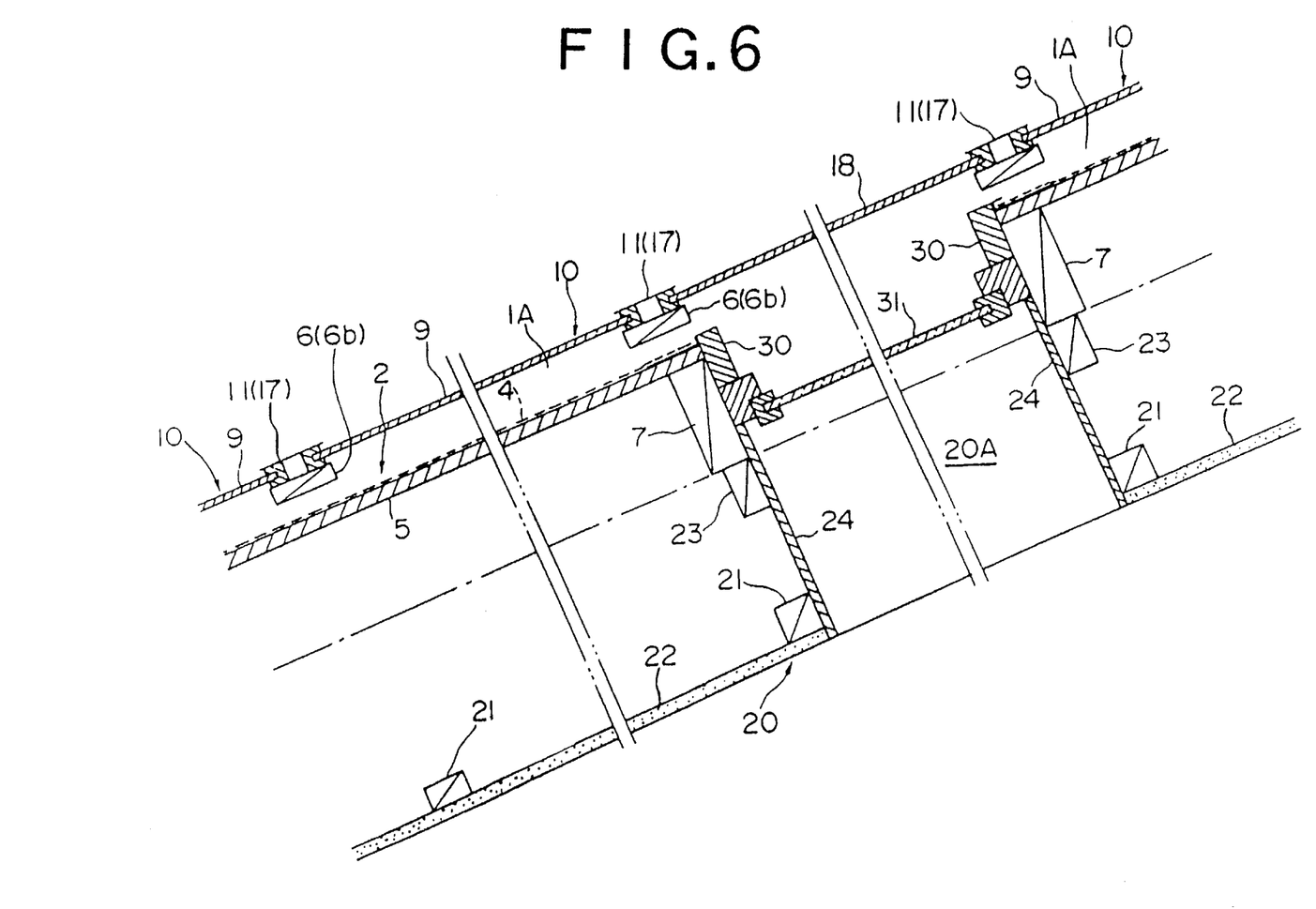
FIG. 6 is a sectional view of a second embodiment in accordance with the present invention.

FIG. 6 depicts the second embodiment of the present invention.

The second embodiment is characterized by having a ceiling window inlaid with a transparent glass (31) through parting boards (30) over the opening (20A) of the ceiling (20). The following other parts are constructed in the same way as the first embodiment. The same reference numerals will be used to designate the same parts and explanation of each will be omitted.

Figure 7:
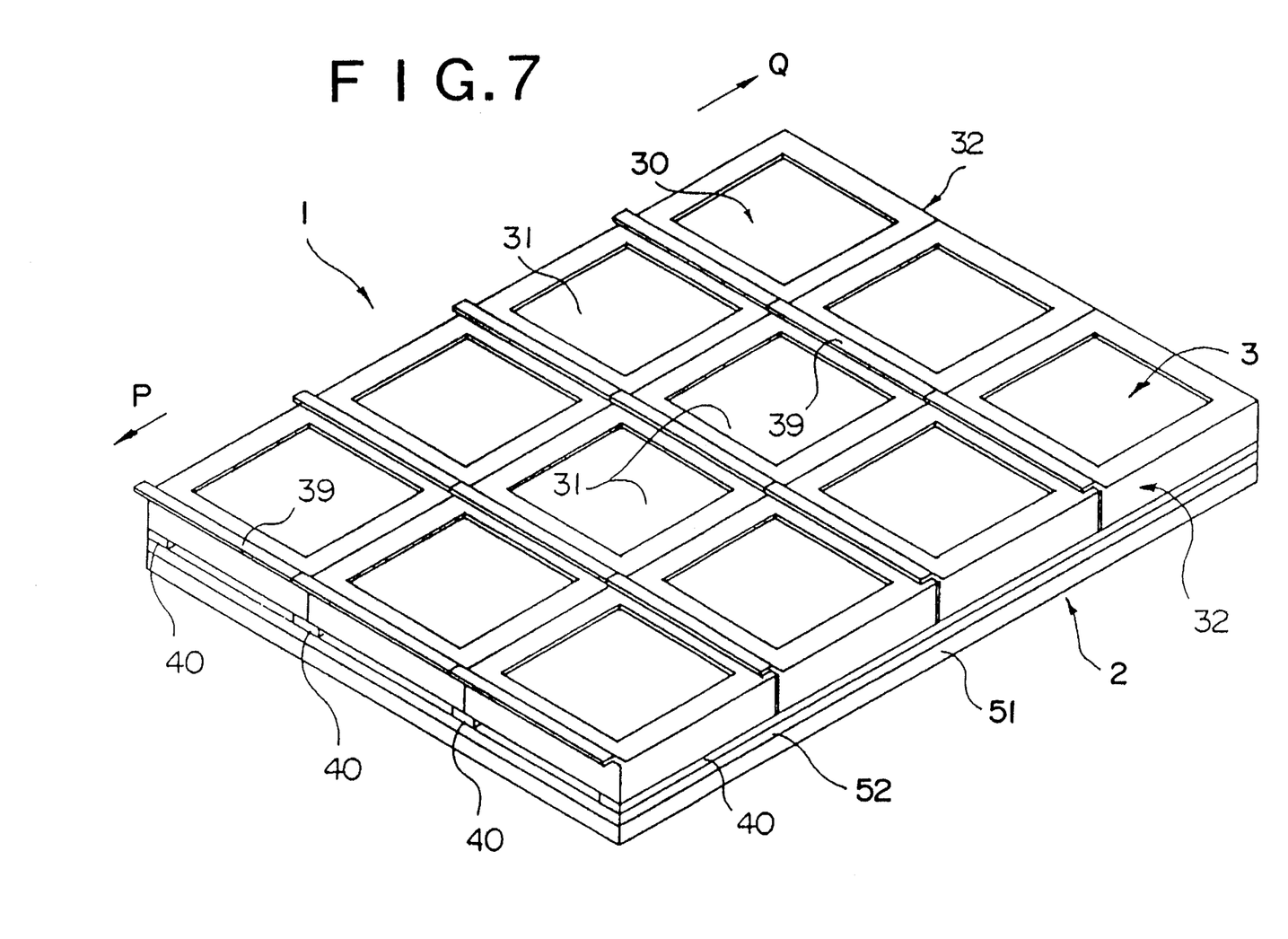
FIG. 7 is a perspective view of a third embodiment in accordance with the present invention.
Figure 8:
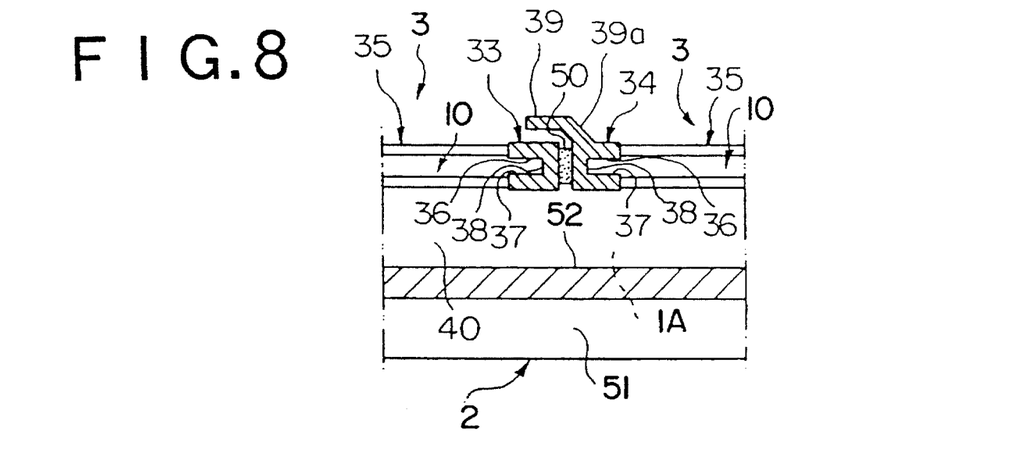
FIG. 8 is a sectional view of a connection portion of the third embodiment.
Figure 9:
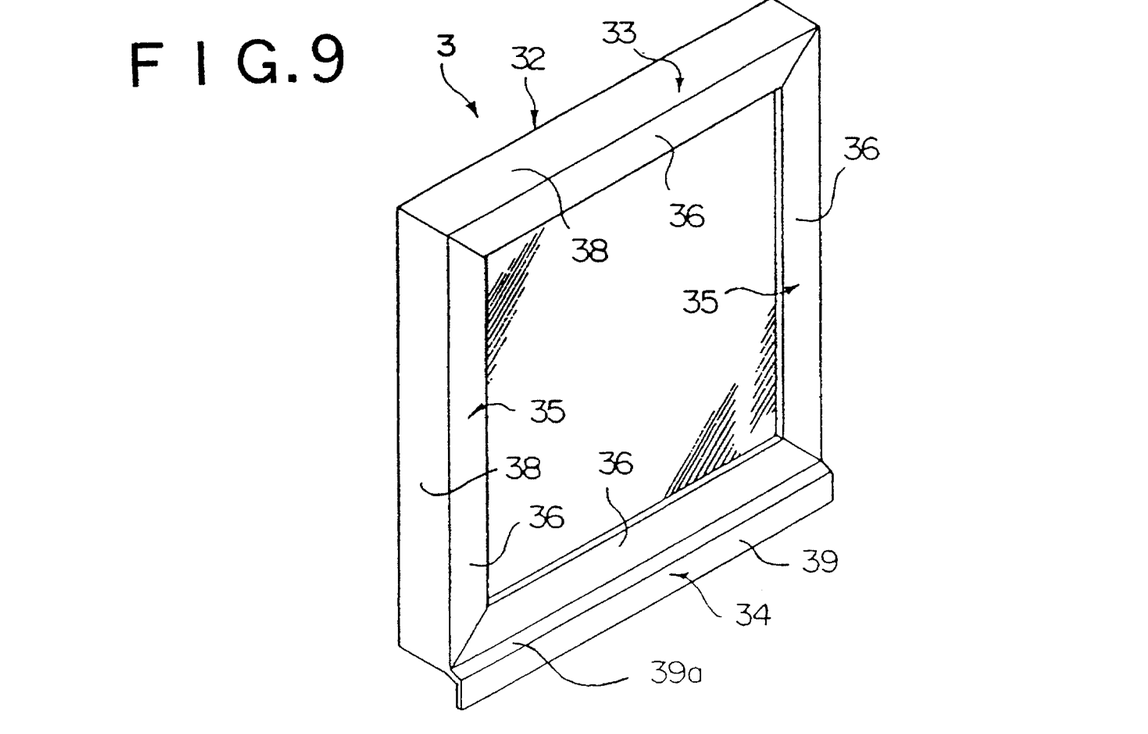
FIG. 9 is a perspective view of a main portion of the third embodiment.

FIGS. 7 to 9 depict the third embodiment of the present invention.

The above mentioned solar battery module (3) which is supported by the frame (11) corresponding to the entire roof panel (1) in the above explained first embodiment is supported with individual frames (32). The remainder is the same as in the above explained first embodiment, so that the individual description is omitted by adding the same reference numerals to the same parts.

In FIG. 7, the roof panel (1) is structured with plural solar battery panels (3) which are arranged on the base panel (2) so that the entire roof panel (1) becomes rectangular, and the longitudinal direction of the roof panel (1) aligns along the slope of the roof from the ridge Q to the eaves P.

The base panel (2) has a rectangular shape defined by the core (51) and the plate (52) which is secured on the core (51) by means of a bonding agent or nails.

The solar battery panel (30) is composed with the solar battery module (3) of a rectangular panel in which a number of solar battery cells are installed in a transparent plate, and the frame (32) structured on all sides of the module (3).

The frame (32) has 3 components, i.e., a frame member (35) and a frame member (34) provided on the top and bottom side of solar battery module (3) and the frame members (35) each provided on the other pair of sides.

The frames (33, 34, and 35) are basically the same structure, that is, a C-shaped section with an upper plate (36), a lower plate (37) and an edge plate (38) to link each other and are made of aluminum extruded material. The upper plate (36) in the frame (34) is connected by way of a slant portion (39a) and an elongated fragment (39) extended to the outside.

The solar battery panels (30) are arranged on the base panel (2) such that the upper frame (33) faces toward the ridge Q, the lower frame (34) towards the eaves P and the longitudinal frame (35) along the sloping line from the ridge Q to the eaves P.

On the base panel 2, a supporting member (40) (corresponding to the longitudinal core 6a in the first embodiment) is attached firmly and the solar battery panel (30) is fitted on the base panel (2) by way of attaching the supporting member (40) to both sides of the longitudinal frame (35). A sealing member (50) is inlaid into the space between the solar battery panels (30) on the same plane.

In such installed state, the extending piece (39) formed at the lower frame (34) of the solar battery panel (30) located on the ridge Q is parallel to the upper plate (36) of the upper frame (33) of the next solar battery panel (30) on the eaves P and covers a part of the upper plate (36).

A space in which the extending piece (39) of the lower frame (34) overlaps the upper plates (36) of the upper frame (33) is provided to prevent the rainwater from going up and infiltrating into among the solar battery modules (3) by the capillary phenomenon.

A space is opened between the base panel (2) and the solar battery panel (30) by the supporting member (4) and the space should be considered as an air ventilation layer (1A) from the eaves P to the ridge Q.

The air ventilation layer (1A) is opened toward the outside of the eaves P and the ridge Q in the same construction of the previous first embodiment. Explanation of remaining structures will be omitted since they have the same or similar functions.

The roof panel (1) in the third embodiment is used as a house roof by being fixed on a beam with the solar battery panel (30) turning up and the upper frame (33) turning to the ridge Q.

When rain-water flows from the solar battery panel (30) of the ridge Q to the solar battery panel (30) of the eaves P on the roof panel (1), the rain-water passes guided by an elongated fragment (39) formed on the lower frame (34) onto the solar battery panel (30) of the eaves P.

Accordingly, it is hard for the rain-water to seep into the space among the solar battery panels (30) arranged along the slope of the roof. Even if the rain-water happens to seep into the crevice between the elongated fragment (39) and the upper frame (33), the sealing member (50) prevents the rain-water from seeping.

In addition, the ventilation layer (1A) extending from the eaves P to the ridge Q and provided between the base panel (2) and the solar battery panel (30) provides cooling of the solar battery module (3), and energy conversion efficiency thus is always maintained high, and stable electric power is supplied as in the first embodiment.

Furthermore, the frame (11) composed of long members as in the first embodiment is not needed because using frame (32) of each module (3) simplifies handling thereof, and it is not required to prepare different frames (11) depending on the width and length of the roof panel (1).

Accordingly, the installation and handling can be simplified by using the solar battery panel (30) consisting of the module (3) and the frame (32).

INDUSTRIAL AVAILABILITY

As described in the above, according to the present invention, cooling of the solar battery module occurs because air passes through the air ventilation layer formed between the base panel and solar battery module, by which the energy conversion efficiency of the solar battery is always maintained effectively and a stable electrical power supply is provided.

Heat transmission to the air going into the air ventilation layer can be reduced and a reduction of the temperature rise of the air passing through the air ventilation layer can be obtained by providing thermal insulation material under the boards of the roof eaves.

Furthermore, the temperature rise of the air going into the air ventilation layer from the eaves can be reduced and the cooling effect of the solar battery can be increased by painting the surface of the eaves flashing white so as to prevent the heat from being absorbed.

As the eaves is provided with upper and lower eaves flashing to communicate the air ventilation layer with the fresh air and with the ventilation louver between such flashings, rain-water, dust, etc., can be prevented from penetrating into the air ventilation layer and the intervals between the flashings can be maintained evenly.

Sufficient electric power can be effectively supplied by providing the necessary number of solar battery modules.

In case the solar battery panel consists of the solar battery module and an elongated frame extended from the eaves side thereof, the eaves side frame of the solar battery panel located at the ridge side is provided with an elongated fragment extending over the ridge side frame of the corresponding solar battery panel located at the eaves side to prevent rain-water from seeping between the solar battery panels laid along the slope of the roof. The solar battery panel located in the ridge side of the solar battery panel located in the eaves side is arranged, so that the rain-water is prevented from seeping between the solar battery panels laid along the slope of the roof. In addition, water seepage can be improved when a sealing member is applied between the both solar battery panels.

What is claimed is:

1. A roof with a solar battery, comprising:
   a base panel extending from a ridge portion to an eaves portion of a sloped roof of a house;
   a solar battery panel arranged along an upper surface of said base panel;
   a frame receiving said solar battery panel;
   a supporting member supporting said frame on said base panel; and
   a ventilation layer provided between said solar battery panel and said base panel to cool said solar battery panel, wherein said eaves portion includes at least two eaves flashings extending therealong which defines a space therebetween communicating with said ventilation layer, and further including a ventilation louver extending between said eaves flashiness to prevent rain and dust from entering into the air ventilation layer and to maintain an even spacing between said eaves flashings.

2. A roof with solar battery in accordance with claim 1, wherein said ventilation layer is opened at the eaves portion and the ridge portion.

3. A roof with solar battery in accordance with claim 1, wherein said base panel has dimensions corresponding to a roof panel and provided with said solar battery panels to supply a necessary respective solar battery panels on each base panel being electrically interconnected one another.

4. A roof with solar battery in accordance with claim 1, wherein said supporting member extends to the eaves portion is provided thereon with the flashing.

5. A roof with solar battery in accordance with claim 4, wherein the eaves flashing is formed thereunder with a heat insulation member.

6. A roof with solar battery in accordance with claim 1, wherein said supporting member extends to the eaves portion and has thereon and thereunder said eaves flashing, wherein the upper eaves flashing is coated with a white-colored coating.

7. A roof with solar battery in accordance with claim 1, wherein said frame is structured into a lattice shape, the lattice shape having a C-shaped portion to engage with peripheral portions of said solar battery panel, wherein said solar battery panel is held at the C-shaped portion through a seal member.

8. A roof with solar battery in accordance with claim 1, wherein said frame has a square shape to surround said solar battery panel.

9. A roof with solar battery in accordance with claim 8, wherein side-by-side solar battery panels are arranged along the sloped direction of the roof, the eaves portion of the frame of the solar battery panel near the ridge side being formed with an extending piece, the extending piece extending to the ridge portion of the frame of the solar battery panel at the eaves side.

10. A roof with solar battery in accordance with claim 9, wherein the extending piece has a tapered portion extending from upper surface of the frame of said solar battery panel at the ridge side and a flattened portion parallelly arranged along the upper surface of frame of said solar battery panel at the eaves side.

11. A roof with solar battery panel in accordance with claim 9, wherein seal members are provided between the frame of said solar battery panel at the ridge portion and the frame of said adjacent solar battery panels at the eaves portion.

12. A roof with a solar battery, comprising:
   a base panel extending from the ridge portion to the eaves portion of a sloped roof of a house;
   a solar battery panel arranged along an upper surface of said base panel;
   a frame receiving said solar battery panel;
   a supporting member supporting said frame on said base panel; and
   a ventilation layer provided between said solar battery panel and said base panel to cool said solar battery panel,
   wherein said ventilation layer is opened at the eaves portion and the ridge portion,
   wherein said supporting member extends to the eaves portion and has thereon and thereunder eaves flashings, the space between said flashing being communicated with said ventilation layer and provided with a ventilation louver and the upper one of the eaves flashings being coated with a white-colored coating,
   wherein said frame has a square shape to surround respective solar battery panels, said solar battery panels being side-by-side arranged along the sloped direction of the roof; the eaves portion of the frame of the solar battery panel near the ridge portion being formed with an extending piece, the extending piece extending to the ridge portion of the frame of the solar battery panel at the eaves portion.

13. A roof with solar battery in accordance with claim 12, wherein the extending piece has a tapered portion extending from upper surface of the frame of said solar battery panel at the ridge side and a flattened portion parallelly arranged along the upper surface of the frame of said solar battery panel at the eaves side.

14. A roof with solar battery in accordance with claim 12, wherein seal members are provided between the frame of said solar battery panel at the ridge side and the frame of adjacent solar battery panels at the eaves side.

15. A roof with solar battery in accordance with claim 12, wherein said ventilation is opened at the eaves portion and the ridge portion.

16. A roof with solar battery in accordance with claim 12, wherein said base panel has dimensions corresponding to a roof panel and provided with a number of said solar battery panels sufficient to provide a necessary voltage, the respective solar battery panels on each base panel being electrically interconnected to one another.

17. A roof with solar battery, comprising:

a base panel extending from the ridge portion to the eaves portion of a sloped roof of house;

a solar battery panel arranged along an upper surface of said base panel;

a frame receiving said solar battery panel;

a supporting member supporting said frame on said base panel; and a ventilation layer provided between said solar battery panel and said base panel to cool said solar battery panel, wherein said ventilation layer is opened at the eaves portion and the ridge portion, wherein said supporting member extends to the eaves portion and has thereon and thereunder eaves flashings, the space between said flashings being communicated with said ventilation layer and provided with a ventilation louver and the upper one of the eaves flashings being coated thereon with a white-colored coating, wherein said base panel has dimensions corresponding to a roof panel and provided with a number of said solar battery panels sufficient to provide a necessary voltage, the respective solar battery panels on each base panel being electrically interconnected to one another, wherein said frame has a square shape to surround respective side-by-side arranged solar battery panels, wherein among said side-by-side arranged solar battery panels along the sloped direction of the roof, the eaves portion of the frame of the solar battery panel near the ridge side is formed with an extending piece, the extending piece extending to the ridge portion of the frame of the solar battery panel at the eaves side, wherein the extending piece has a tapered portion extending from the upper surface of the frame of said solar battery panel at the ridge side and a flattened portion parallelly arranged along the upper surface of the frame of said solar battery panel at the eaves side, and wherein seal members are provided between the frame of said solar battery panel at the ridge side and the frame of said adjacent solar battery panels at the eaves side.

* * * * *